United States Patent
Lim (10) Patent No.: US 7,336,528 B2
(45) Date of Patent: Feb. 26, 2008

(54) ADVANCED MULTI-BIT MAGNETIC RANDOM ACCESS MEMORY DEVICE

(75) Inventor: Chee-kheng Lim, Suwon-si (KR)

(73) Assignee: Samsung Electronics Co., Ltd., Suwon (KR)

( * ) Notice: Subject to any disclaimer, the term of this patent is extended or adjusted under 35 U.S.C. 154(b) by 119 days.

(21) Appl. No.: 11/117,453

(22) Filed: Apr. 29, 2005

(65) Prior Publication Data

US 2006/0087881 A1   Apr. 27, 2006

(30) Foreign Application Priority Data

Oct. 27, 2004   (KR) .................. 10-2004-0086392

(51) Int. Cl.
*G11C 11/14* (2006.01)
(52) U.S. Cl. .............. 365/171; 365/230.07; 365/173
(58) Field of Classification Search ............ 365/171, 365/230.07, 173, 63, 158, 209, 225.5, 51
See application file for complete search history.

(56) References Cited

U.S. PATENT DOCUMENTS

| | | | |
|---|---|---|---|
| 6,005,800 A | 12/1999 | Koch et al. | |
| 6,700,720 B1 | 3/2004 | Allenspach et al. | |
| 6,740,947 B1 * | 5/2004 | Bhattacharyya et al. | 257/421 |
| 6,836,429 B2 * | 12/2004 | Smith et al. | 365/158 |
| 6,914,810 B2 * | 7/2005 | Hosotani | 365/173 |
| 6,944,053 B2 * | 9/2005 | Anthony et al. | 365/173 |
| 6,950,369 B2 * | 9/2005 | Kunikiyo et al. | 365/230.07 |
| 2001/0048608 A1 * | 12/2001 | Numata et al. | 365/158 |
| 2003/0209769 A1 | 11/2003 | Nickel et al. | |
| 2005/0180203 A1 * | 8/2005 | Lin et al. | 365/171 |

FOREIGN PATENT DOCUMENTS

| EP | 1 398 835 A1 | 3/2004 |
|---|---|---|
| EP | 1 600 977 A2 | 11/2005 |

* cited by examiner

*Primary Examiner*—Van Thu Nguyen
*Assistant Examiner*—Dang Nguyen
(74) *Attorney, Agent, or Firm*—Sughrue Mion, PLLC (57) ABSTRACT

An advanced multi-bit magnetic random access memory device and a method for writing to the advanced multi-bit magnetic random access memory device. The magnetic memory includes one or more pair-cells. A pair-cell is two memory cells. Each memory cell has a magnetic multilayer structure. The structure includes a magnetically changeable ferromagnetic layer, a ferromagnetic reference layer having a non-changeable magnetization state, and a corresponding spacer layer separating the ferromagnetic layers. The memory cells are arranged such that an effective remnant magnetization of each of the cells is non-parallel from the cells' long-axis. This allows for more than one-bit to be stored as well as for efficient writing and reduced power consumption.

32 Claims, 7 Drawing Sheets

ADVANCED MULTI-BIT MAGNETIC RANDOM ACCESS MEMORY DEVICE

CROSS-REFERENCE TO RELATED APPLICATIONS

This application claims priority from Korean Patent Application No. 2004-0086392 filed Oct. 27, 2004, the contents of which are incorporated herein by reference in their entirety.

BACKGROUND OF THE INVENTION

1. Field of the Invention

The present invention relates to magnetic random access memory, and more particularly to an advanced multi-bit magnetic random access memory device and a method for writing to the advanced multi-bit magnetic random access memory device.

2. Description of the Related Art

Rapid growth in digital information generation is likely to face a new wave of explosion in high density memory demand due to the growing popularity of mobile devices. Magnetic random access memory (MRAM) is one of the most promising candidates to provide energy efficient and non-volatile memories.

The most attractive advantages of MRAM are that the mobile device retains the current state of work when powered down, and, additionally, longer battery run-times can be provided for mobile devices from notebook computer to cell-phones, since non-volatility enables MRAM chips to consume less power than conventional Dynamic Random Access Memory (DRAM) and Static Random Access Memory (SRAM). MRAM operates on the principle of storing data bits using magnetic charges instead of electrical charges as used by DRAM and SRAM.

Figure 10:
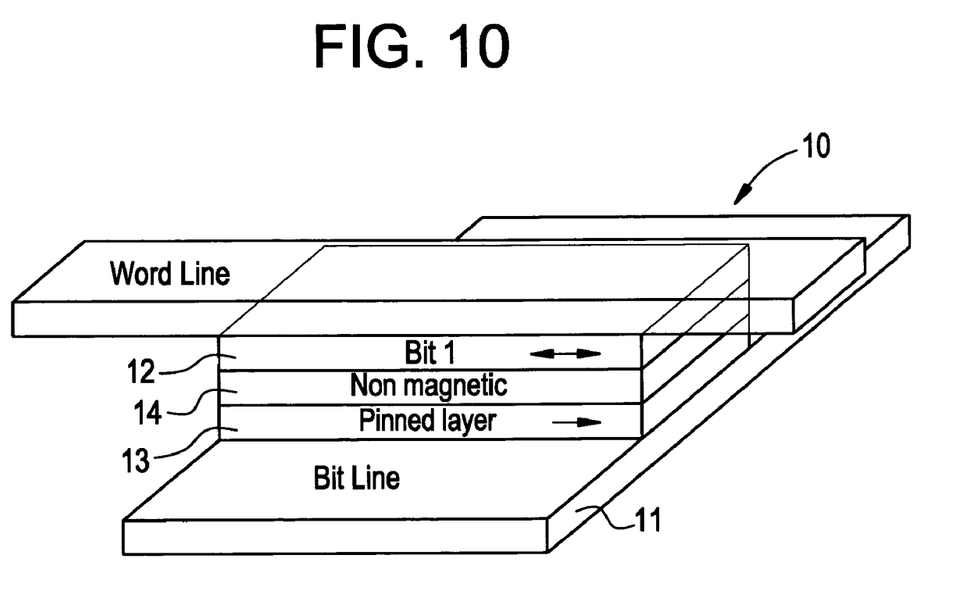
FIG. 10 illustrates a basic MRAM cell structure with one memory cell located at the intersection between Word and Bit lines.

In the related art, an MRAM is known where one bit of information is stored in a magnetic multilayer cell, which comprises both magnetic and non-magnetic layers. As shown in FIG. 10, in its simplest form, a magnetic multilayer memory cell 10 includes four layers. These layers include an antiferromagnetic layer 11, and two ferromagnetic layers 12, 13 separated by a non-magnetic spacer layer 14.

The non-magnetic spacer layer 14 may either be conductive or non-conductive. In a memory having a conductive spacer, a spin-valve element is created, while a memory having a non-conductive spacer layer produces a magnetic tunnel junction (MTJ) magnetoresistive element.

One of the ferromagnetic layers 13 is exchange-coupled to the antiferromagnetic layer 11, effectively pinning the orientation of magnetization in the ferromagnetic layer 13. This ferromagnetic layer 13 is known as the pinned layer.

When an external magnetic field is applied to such a cell, the magnetization of the other ferromagnetic layer 12, the so-called free layer (the non-pinned layer), will react to the field.

Sensing or reading the information stored in the cell is based on a magnetoresistance effect.

The electrical resistance of such a multilayer cell 10 depends on the relative orientation of the magnetization in the two ferromagnetic layers 12, 13. In this case, there is low resistance when both magnetization orientations are in parallel (P) alignment and high resistance when they are in antiparallel (AP) alignment.

The building block of the MRAM architecture is its crossed-wires structure, where a magnetic element is located at the intersection point of two orthogonal wires. The writing or addressing process of an MRAM cell is accomplished by applying two orthogonal magnetic field pulses, generated by sending an electrical current, down the wires. The two wires are often referred to as the word line (Hy field, along the short axis of the magnetic element) and the bit line (Hx field, along the long axis (or easy axis) of the magnetic element).

The strength of the magnetic fields applied are such that one field alone cannot switch the magnetization of a magnetic element, but rather it requires the combination of both magnetic fields from the word and bit lines, for cell selectivity. However, the present cell writing technology relies on applying a long magnetic field pulse, tens of nanoseconds, long enough for the magnetization to reach the final equilibrium state. This method of writing is also known as the quasistatic writing which is not only slow, but also not energy efficient.

Also, in such a memory having a multilayer cell structure, there is a limitation of memory density. In most cases, only one bit of information can be stored at the cross-point (the intersection point of the two orthogonal wires) in the MRAM architecture.

Recent attempts have been made to overcome this limitation of memory density. For example, U.S. Patent Publication 2003/0209769 to Nickel et al. discloses an MRAM device having a multi-bit memory cell. In particular, each memory cell includes two magnetoresistive devices connected in series.

Each of the two magneto-resistive devices has sense layers with distinctly different coercivities and, therefore, requires different writing currents. Thus, write operations can be performed selectively on the two magneto-resistive devices. Each multi-bit memory cell has four logic states with different resistance values in each state. This allows for storage of more data than a related art single-bit memory cell, which has only two logic states.

U.S. Pat. No. 5,930,164 to Zhu also discloses a magnetic memory device having four logic states and an operating method thereof. The memory device of Zhu includes a multi-bit system accomplished by stacking two or more memory cells on top of each other separated by a thick conductive layer to prevent magnetic coupling between memory cells.

In Zhu, each memory cell comprises a free magnetic data layer to store one bit of information, a hard magnetic layer as a reference layer, and a barrier layer between the free and hard magnetic layer. Essentially, each memory cell is an independent MTJ device. The memory cells have distinct coercivities, therefore allowing independent cell writing by one or two magnetic fields. For sensing or reading process, these memory cells have different Magnetoresistance (MR) ratios, therefore creating four resistance states for sensing of multi-bit information. The writing method, however, relies on a quasistatic writing method which is not only slow, but also not energy efficient.

U.S. Pat. No. 5,703,805 to Tehrani et al. discloses a method for detecting information stored in an MRAM cell having two magnetic layers with different thicknesses.

In the Tehrani et al. device, there are two magnetic data layers separated by a non-magnetic spacer. Each magnetic data layer can store one bit of information. A writing process for this device uses differing coercive forces for the two magnetic data layers, hence, independent writing is possible using a quasistatic method. A quasistatic writing method relies on applying a long magnetic field pulse of several nanoseconds that is long enough for the magnetization of a cell to reach a final equilibrium state. As noted above, this method of switching is not only slow, but also not energy efficient.

Further, the reading process of the Tehrani et al. device is very complex since six magnetic fields are required to determine the state in each data layer separately. This creates a slow and inefficient reading process.

Finally, U.S. Pat. No. 6,590,806 to Bhattacharyya discloses a device having two magnetic data layers separated by a pair of antiferromagnetically coupled magnetic layers. The two free magnetic data layers have distinct coercivities and hence, independent writing is possible.

The Bhattacharyya device has four resistance states depending on the magnetic configuration of the free data layers to the antiferromagnetically coupled layers. Therefore, the reference layer for the magnetoresistance effect are the pair of antiferromagnetic coupled layers. This means that if this device is to be used for additional data layers, each data layer requires one pair of antiferromagnetic layers, providing for a complicated device structure. Also, the device relies on the conventional quasistatic writing method.

Further, the manufacturing process of related art MRAM devices has only been known to produce low yields of the memory due to high sensitivity to cell defects, which causes domain nucleation, and hence, wide switching field distribution.

SUMMARY OF THE INVENTION

Illustrative, non-limiting embodiments of the present invention overcome the above disadvantages and other disadvantages not described above. Also, the present invention is not required to overcome the disadvantages described above, and an illustrative, non-limiting embodiment of the present invention may not overcome any of the problems described above.

According to an aspect of the present invention, an advanced multi-bit magnetic random access memory and a method for writing to the multi-bit magnetic random access memory that improves the memory density of MRAM, and also simplifies the memory fabrication process by reducing the number of electrical current lines.

According to another aspect of the present invention, a multi-bit MRAM device is provided which stores more than one bit of information at one intersection between the bit and word lines. In a non-limiting embodiment, two independent information bits are stored in a pair of memory cells (a pair-cell) where each memory cell holds a single bit of binary information. Stacking procedures leading to four and eight bits cells are also disclosed. Of course, one of ordinary skill in the art will recognize that similar multiple bit cells may be realized using the same principles as for the two, four, and eight-bit cells.

More particularly, in an exemplary embodiment of the present invention, the magnetic memory comprises one or more pair-cells, each pair-cell comprising two memory cells, and each memory cell having a magnetic multilayer structure. The multilayer structure of each memory cell comprises a magnetically changeable ferromagnetic layer, a ferromagnetic reference layer having a non-changeable magnetization state, and a corresponding spacer layer separating the ferromagnetic layers. Further, the memory cells are arranged or shaped such that an effective remnant magnetization of each of the cells is non-parallel from the long axis of the cells (i.e., the remnant magnetization of each of the cells is not parallel to one other).

According to another aspect of the present invention, a memory is provided that allows for fast and efficient switching. This may be accomplished by spin precessional switching. Except for high operation frequencies, spin precessional switching is energy efficient because it requires a lower switching field as compared to the aforementioned quasistatic writing process. Shorter field pulses further reduce power consumption.

The writing scheme in one of the embodiments of the invention uses the spin precessional nature of ferromagnetic material in which an easy axis magnetic field (+Hx or −Hx) used to define the final state of the memory (1 or 0) is combined with an orthogonal hard axis excitation field (+Hy or −Hy) to initiate spin precession. In this switching process, the Hx or Hy field alone is not able to switch the magnetization. Rather, the combination of the Hx and Hy fields is the essence of selective writing in the memory array. Spin precessional switching as used in the invention preferably uses a fast rising Hy field, in the order of 0.5 ns or less.

In an exemplary embodiment of the invention, the Hy excitation field pulse is required to have a very short rise time (<0.5 ns) and pulse duration is of the half the magnetic spin precession period.

The pair of memory cells can either have individual CMOS or shared CMOS for separated reading of stored information.

Ultra-fast magnetization switching dynamics is governed by the damped precession of magnetization about an effective magnetic field, $H_{eff}$. The effective magnetic field $H_{eff}$ is the sum of the applied fields and the magnetic anisotropy field of the memory cell which is dominated by the shape anisotropy.

The motion of magnetization M is described by the Landau-Liftshitz-Gilbert (LLG) equation, $dM/dt=-\gamma(M \times H_{eff})+(\alpha/Ms)(M \times dM/dt)$, where M is the magnetization vector, $\gamma$ is the gyro-magnetic constant, $\alpha$ is the phenomenological Gilbert damping constant, and Ms is the saturation magnetization. In the case of MRAM, the effective applied magnetic field is the vector sum of the Hx and Hy.

A fast rising magnetic field pulse applied orthogonal to the M direction will generate a large torque, $\gamma(M \times H_{eff})$. As a result, M is excited into precession around the effective field direction. The first term in the LLG equation is the precession term, which describes the spin precession, and the second term is the energy dissipation term that dictates the rate of energy dissipation. Adapting spin precessional switching promises high-energy efficiency as well as an ultrafast switching speed.

One of the most important natures in precessional switching of the invention is that the precession frequency f depends on the effective magnetization and effective applied magnetic field. It can be expressed as $f^2=(\gamma/2\pi)^2 (H_{eff}+M_{eff})+H_{eff}$ where $\gamma=28$ GHz/T. This is also known in the art as the Kittel formula. The equation leads to the fact that it is possible to manipulate the spin precession frequency by controlling the effective magnetization and effective field experienced by the spin.

Accordingly, a writing method according to an exemplary embodiment of the invention, for a magnetic memory comprises applying a first magnetic field below a switching field of a pair-cell along the long axis (a bit line) of the memory cells; and applying a second magnetic field orthogonal to the first magnetic field, the second magnetic field having a strength sufficient (for example, stronger than the first magnetic field) to create a spin precession angle large enough to switch magnetization of one memory cell of the pair-cell to an opposite direction but not enough strength to switch the magnetization of the other cell of the pair-cell.

The second magnetic field is turned-off as soon as the magnetization of the one cell has precessed to more than about ½ but less than about ¾ of the precession cycle. For example, when a spin excitation field (e.g Hy) is applied, the magnetization begin to spin from −1 to 0 to 1 to 0 to −1, etc. Therefore, to get the magnetization to stop at 1, the applied field needs to be turned-off when the magnetization has crossed the zero point and is in the 0 to 1 section. The magnetization cannot just stop anywhere, it has only two possibilities, 1 or −1.

In exemplary embodiments of the invention, the first magnetic field is kept constant for a certain time duration (>0.5 ns) after the second magnetic field is turned-off, or in other words, the magnetic field duration of Hy is always shorter than Hx.

In this exemplary embodiment, the first magnetic field is applied along the horizontal axis and is used to define the final magnetization state of the cell intended for switching. The second magnetic field is referred to as the spin precessional excitation field (along the word line).

BRIEF DESCRIPTION OF THE DRAWINGS

The above and other aspects of the present invention will become more apparent by describing in detail exemplary embodiments thereof with reference to the attached drawings in which.

DETAILED DESCRIPTION OF EXEMPLARY
EMBODIMENTS OF THE PRESENT
INVENTION

Hereinafter, exemplary embodiments of the present invention will be described in detail with reference to the accompanying drawings.

Aspects of the present invention, and methods for achieving them will be apparent to those skilled in the art from the detailed description of the exemplary embodiments together with the accompanying drawings. However, the scope of the present invention is not limited to the exemplary embodiments disclosed in the specification, and the present invention can be realized in various types. The described exemplary embodiments are presented only for completely disclosing the present invention and helping those skilled in the art to completely understand the scope of the present invention, and the present invention is defined only by the scope of the claims.

In a first exemplary embodiment of the invention, a multi-bit MRAM is created by a pair of spin-excitation-field-polarity dependent memory cells. The pair of memory cells (a pair-cell) react differently according to an applied excitation magnetic field polarity.

The first exemplary embodiment includes a memory cell shape which has its effective remnant magnetization direction slightly tilted off the easy-axis or long-axis of the cell element.

The remnant magnetization in the pair-cell is tilted in the opposite direction from the easy axis. This feature allows manipulation of their magnetization independently. Therefore, two bits of information can be stored at one cross-point in the MRAM architecture, accordingly reducing the number of bit and word lines used for the reading and writing processes. As a direct result, a higher magnetic memory density is possible.

Storing two bits of information at one cross-point is possible since writing or changing the magnetization of the free layer of one cell can be accomplished without affecting the information already stored in the other cell.

Figure 1:
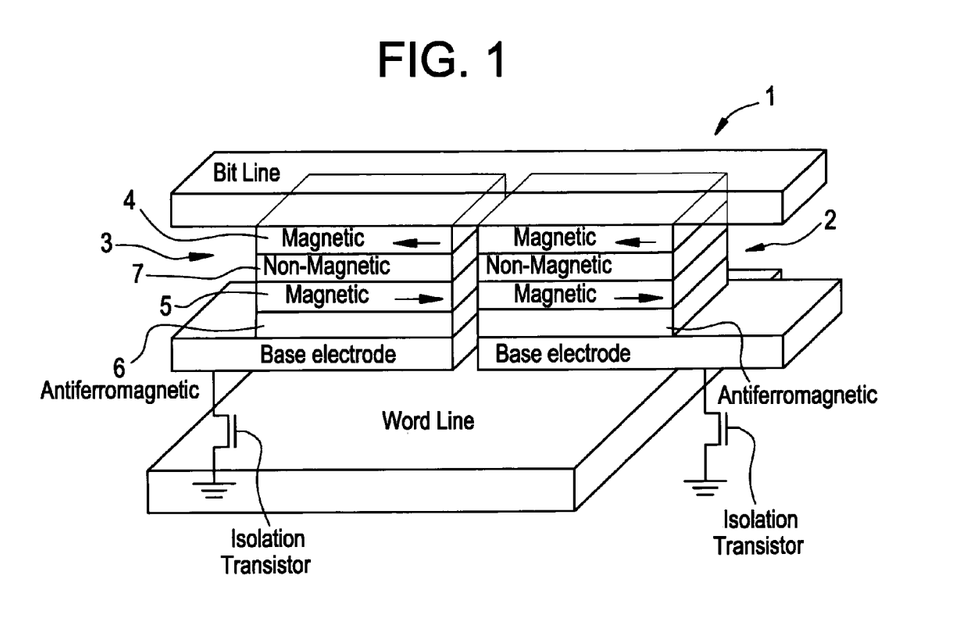
FIG. 1 schematically illustrates a multibit device according to an exemplary embodiment of the present invention including two magnetic memory cells (a pair-cell) at one intersection point between the word and bit current lines in the MRAM architecture.

FIG. 1 schematically shows the first exemplary embodiment of the present invention. The multi-bit MRAM 1 includes magnetic and non-magnetic multilayers.

The multibit MRAM includes two magnetic memory cells 2, 3 (a pair-cell) at one intersection point between the word and bit current lines in the MRAM architecture. In the exemplary embodiments of the invention, the memory cells may share the same orthogonal current line (i.e., the same bit and word lines). Further, the memory cells may have a shared or separate transistor for the sensing operation.

Each of the magnetic memory cells 2, 3, in its most basic form, comprises two ferromagnetic magnetic layers 4, 5, where one the layers 4 acts as a free layer in which magnetization orientation can be altered by an applied external field, while the other magnetic layer 5 serves as a reference layer in which the magnetization direction is fixed or pinned by an antiferromagnetic layer 6 via an exchange bias mechanism. Layer 5 is referred to as the pinned layer.

A non-magnetic spacer layer 7 is accommodated between the ferromagnetic magnetic layers 4, 5. The non-magnetic spacer layer 7 may be either a conductive layer or a nonconductive layer. In the case for a conductive spacer layer, the memory device forms a Giant Magnetoresistance (GMR) structure. On the other hand, a non-conductive layer leads to a MTJ structure.

In either case, the electrical resistance of the multi-bit MRAM according to the invention depends on the relative orientation of magnetization in both the free magnetic layer 4 and the fixed or pinned magnetic layer 5. When the magnetization of these two magnetic layers 4, 5 is in parallel, a low electrical resistant state is generated. Conversely, the resultant resistance is high when the two magnetic layers 4, 5 have an antiparallel alignment. These two states of resistance form the basis of two memories states, 1 and 0.

During a write process, two electrical currents are applied, one along the bit line and the other along the word line. Thus, two orthogonal magnetic fields are generated. The two memory cells can either have a separated CMOS or a shared CMOS for the sensing/writing procedure.

The magnetic layer 4 is the data layer where information is stored, and from which information is read. Magnetization of the layer 4 can be changed via an externally applied magnetic field and/or a spin-polarized electrical current.

Of course, a four-bit cell will have two free magnetic layers 4 per cell. In this case, the free magnetic layers 4 may also have distinct magnetic and physical properties such as saturation magnetization, magnetic anisotropy, layer thickness, magnetostriction coefficient, coercivity, damping constant, and materials, among others.

The magnetically changeable ferromagnetic layers 4 may include the same or differing ferromagnetic material, as well as a same or differing thickness. In exemplary embodiments, the material may comprise an alloy of Ni, Fe, and Co, or a combination thereof. Further, the ferromagnetic material of one memory cell may be different from the other cell, allowing for more efficient spin precession.

Figure 2:
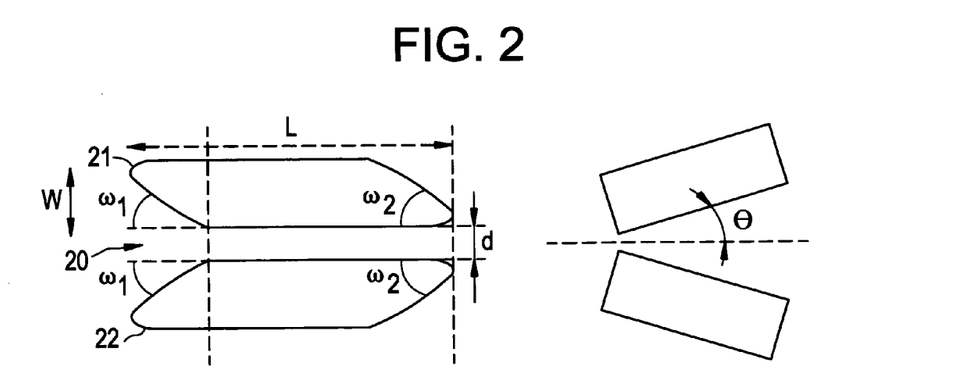
FIG. 2 depicts creating a non-parallel magnetization in the pair cells using shape and/or non-parallel cells alignment.

FIG. 2 illustrates the shape of cells of the multi-bit MRAM according to an exemplary embodiment of the invention. In the exemplary embodiment, the multi-bit MRAM is designed such that its effective magnetization is not exactly along the long-axis of the element, but slightly tilted clockwise or counter-clockwise, due to shape magnetic anisotropy.

This tilting is caused by the demagnetizing field created by the cell, which always keep the magnetization orientation parallel to a flat surface. At the edge of the cell, the magnetization orientation keeps its orientation parallel to the surface. As a result, this creates a net or effective magnetization orientation along the cell's diagonal axis.

Accordingly, when a fast orthogonal magnetic field pulse is applied to initiate magnetic spin precession, the precession cone is different between the positive and negative excitation field. Therefore, the magnetization direction in this magnetic element can only be switched by one excitation field polarity but not the opposite below a certain switching field threshold, hence offering selective writing. For example, suppose a magnetic field pulse is applied with a field strength below the threshold value for selective writing. If the Hy is above this threshold value, both magnetic elements will be switched together.

As shown in FIG. 2, a pair-cell 20 includes two memory cells 21, 22 which have the same shape. However, differing cell shapes may also be used among the cells. As shown, the memory cells 21, 22 have a shape such that shorter ends of each cell are at angles that are not perpendicular to the long-axis of the cell ($\omega_1$ and $\omega_2 \neq 90°$).

In the pair-cell 20 shown, each cell 21, 22 has shorter edges tilted at angles $\omega_1$ and $\omega_2$ in opposing directions from corresponding shorter edges of the other cell. Further, one cell 21 has its shorter edges tilted above a horizontal plane while the other cell 22 has its shorter edges tilted below the horizontal plane.

The tilting angles of the edges $\omega_1$ and $\omega_2$ are less than 90°, respectively, and in exemplary embodiments of the invention, in a range of about 5° to 85°. In addition, these angles $\omega_1$ and $\omega_2$ may be different among the cells. The pointed end of the cells (the edges) may also be slightly rounded, as shown, to allow for suppression of magnetic domain nucleation. Of course, cells with non-rounded or sharp edges will work as well.

Further, in the exemplary embodiment depicted in FIG. 2, although cells 21, 22 have the same shape, they may be fabricated such that their long axis are not in parallel, but form an angle θ with the horizontal axis. In exemplary embodiments, the angle θ is in a range of about 1° to 85°. The cell shapes may include, for example, rectangular and elliptical shapes.

Further still, in another exemplary embodiment, the cells 21, 22 may be configured such that one cell forms an angle θ with the horizontal axis, and the other cell includes a tilting angle ω of an edge. That is, the configurations of the cells may include a combination of features of the aforementioned θ and ω among the cells.

In an exemplary embodiment, the aspect ratio of the cells is between 1.1 and 3.0, and the cells may have the same or differing aspect ratios.

When using pair-cells, it becomes advantageous to sufficiently separate the cells so that the magnetostatic coupling between cells is minimized. In the exemplary embodiment shown in FIG. 2, the separation distance d between cells 21, 22 is ½ W, where W represents a width of a cell. In this case, the separation should be greater than ½ W.

Figure 3:
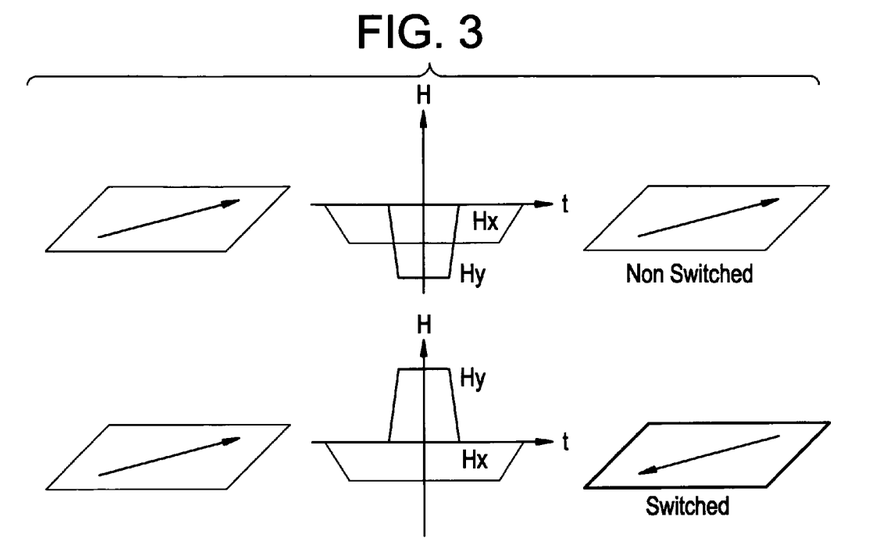
FIG. 3 illustrates a writing procedure according to an exemplary embodiment of the present invention in which the magnetization of the magnetic element is initially pointed to the right +X direction and external fields are applied to switch the magnetization of the magnetic element to the −X direction.
Figure 4:
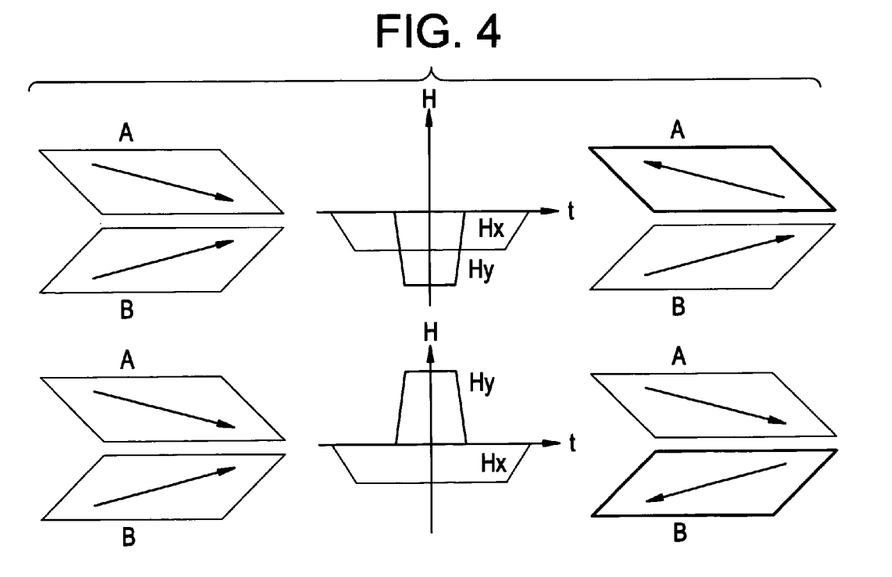
FIG. 4 illustrates an independent cell addressing procedure of a pair magnetic memory cells.

A writing method according to an exemplary embodiment of the invention is explained using FIGS. 3 and 4.

In FIG. 3, the magnetization of a magnetic element is initially pointed to the right +X direction and external fields are applied to switch it to the −x direction. First, a weak −x direction magnetic field is applied which is followed by a stronger and fast −y direction excitation field. However, in this case, due to the smaller precession cone (e.g., where the precession does not crosses zero to the other half of the cycle), the magnetization direction is not changed.

Further, the magnetization of the magnetic element initially pointed in the +x direction may be changed when a y-axis excitation field is applied in the positive direction. Accordingly, selective switching is accommodated.

FIG. 4 depicts an independent cell writing (addressing) procedure of a pair of magnetic memory cells according to an exemplary embodiment of the invention. The memory cells of the pair-cell, labeled as cell A and cell B, initially have their magnetization oriented in the +x direction.

In FIG. 4, when the y-axis excitation field is applied in the negative direction, cell A is switched to the −x direction while leaving cell B unchanged.

Similarly, as shown, if the y-axis excitation field is applied in the positive direction, then cell B will be switched to the negative direction while cell A remains in its original direction. Hence, the magnetic memory cell of the invention may be excitation-field-polarity dependent. Accordingly, this behavior leads to allowing a single-cell selection in the multi-bit cell design of the present invention.

In the writing method of the exemplary embodiment, the second applied magnetic field (the spin-precessional excitation field) may be turned-off as soon as the magnetization of the one cell, for example, cell B, has precessed to more than ½ but less than ¾ of the precession cycle. Subsequently, the first applied magnetic field (the easy axis field) is turned-off after the second applied magnetic field is turned-off. Likewise, the pulse of the easy axis field should have a longer duration than a pulse of the spin-precessional excitation field. In an exemplary embodiment, the pulse duration of the easy axis field is in a range of about 0.2 to 10 ns, while a pulse duration of the spin-precessional excitation field may be in a range of about 0.01 to 5 ns.

The selectivity of writing of the multibit MRAM of the present invention in exemplary embodiments is based on the physics that the effective field generated by Hx and Hy exert a different torque on the magnetic moment of the pairs cells. The torque required to reverse the magnetization direction is maximum when Heff is perpendicular to the magnetization direction and minimum when antiparallel.

In addition, the memory cells of the invention may have the same or differing spin precession frequencies. Also the memory cells may have the same or differing magnetic damping constants to provide for better energy dissipation, as needed.

Figure 5A:
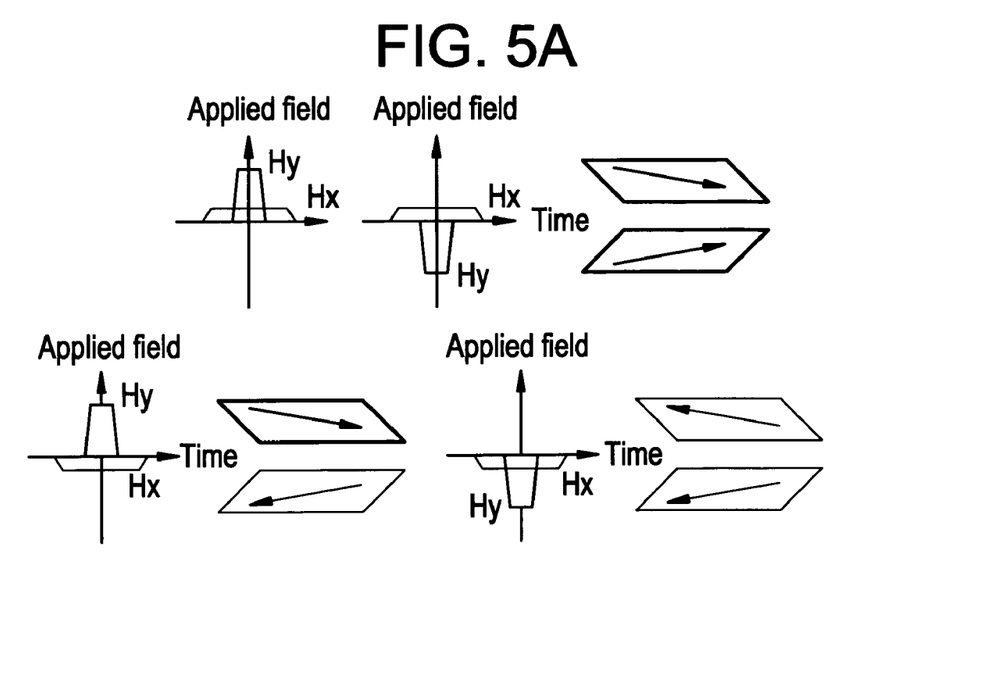
FIG. 5A schematically shows an initialization of the pair cells in +x direction by first applying (+Hy)+(+Hx) followed by (−Hy)+(+Hx)

FIG. 5A schematically shows an initialization of the pair cells in +x direction by first applying (+Hy)+(+Hx) followed by (−Hy)+(+Hx).

Figure 5B:
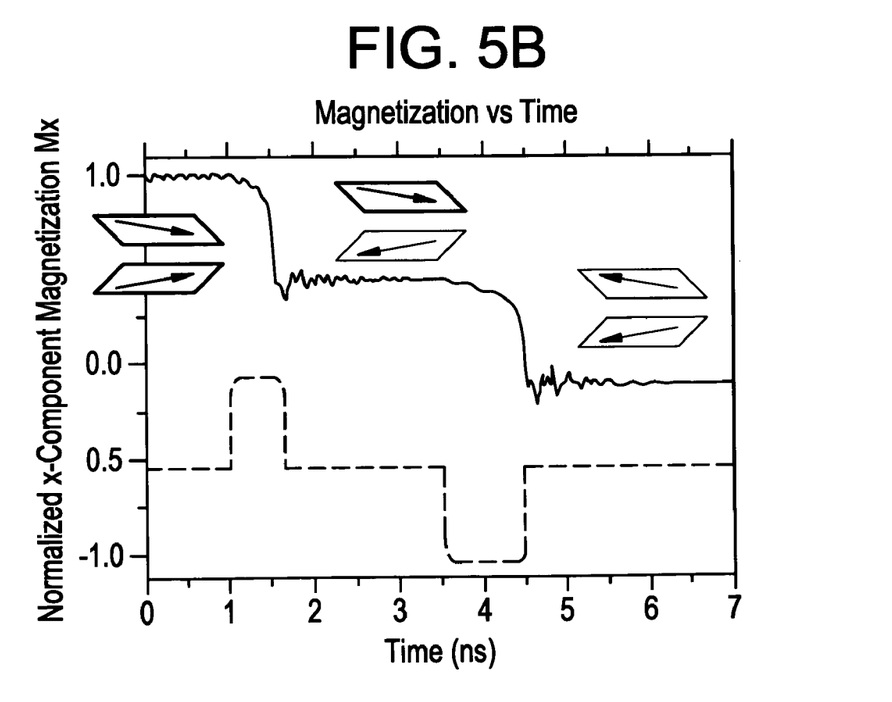
FIG. 5B depicts a simulation of the multi-bit MRAM pair-cell using Finite Element Micromagnetic simulation.

FIG. 5B depicts a chart created using 3D Finite Element Micromagnetic simulation software to simulate a pair-cell according to an exemplary embodiment of the invention.

As shown in FIG. 5B, a simulation result is obtained for Mx against time. The dotted line shows the timing of Hy. The normalized Mx is zero when both cells are switched because the magnetization of the fixed layer is still in +x.

The magnetization in the x, y and z-direction (Mx, My and Mz) may be calculated as a function of time by solving the Landau-Liftshitz-Gilbert equation for the pair of memory cells.

Initially, both cells have positive Mx, thus average unity magnetization. It can be seen that when a positive excitation field is applied (t=1 ns), that Mx decreases to half. This indicates that the x component of magnetization of the pair cell is in antiparallel alignment, hence half net magnetization.

At t=3.5 ns, a second negative excitation field is applied. This switches the remaining cell to the −x direction, hence net magnetization is zero. In this case, both memory cells have negative x-component magnetization. In FIG. 5B, the thick, solid line shows the total magnetization evolution with time and the thin dotted line shows the applied Hy.

Figure 6:
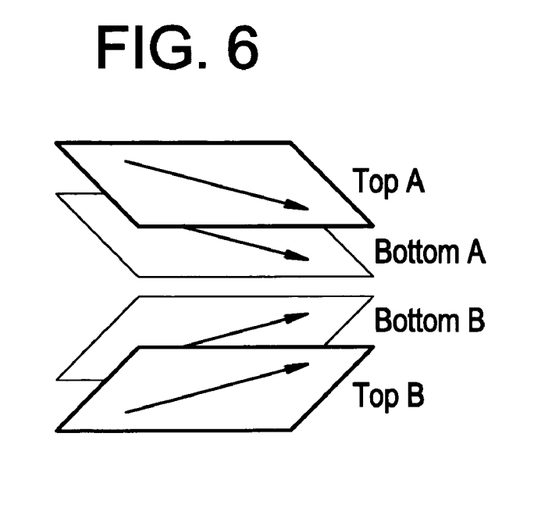
FIG. 6 is a schematic drawing showing a four-bit cell structure according to an exemplary embodiment of the present invention.

Of course, the present invention is not limited to a two-bit memory structure. For example, a four-bit cell structure is shown in FIG. 6.

The bottom free magnetic layers of this four-bit embodiment are labeled "Bottom A" and "Bottom B" while the top free magnetic layers are labeled "Top A" and "Top B". These four magnetic layers are able to store one bit of binary information each and it is possible to address each bit independently. This may be achieved by using different ferromagnetic material for the bottom and top free layers. This structure gives a total of 8 logic states.

A writing procedure for this four bit structure is similar to the method described above where the magnetic memory cells may be excitation-field-polarity dependent. Table 1 below shows a writing method for each magnetic configuration state using a 4 bit cell which can include sixteen (16) combinations for writing.

In Table 1, Hx_th is the Hx field above the threshold field to switch both layers together, and Hx is below the threshold and can only switch one layer. The Top1 and Bottom1 are written by +Hy and the Top2 and Bottom2 are written by −Hy. Further, the Bottom layer be the magnetically harder layer. Additionally, in the writing method, +Hx writes 1 and −Hx writes 0. In Table 1, the contents of the square bracket correspond to [Top1, Bottom1, Top2, Bottom2].

TABLE 1

| +Hx_th and ±Hy | [1,1,1,1] | −Hx_th and +Hy | [0, 0, 1, 1] | −Hx and −Hy | [0, 0, 0, 1] | +Hx and +Hy | [1, 0, 0, 1] |
|---|---|---|---|---|---|---|---|
| | | | | +Hx and +Hy | [1, 0, 1, 1] | −Hx and −Hy | [1, 0, 0, 1] |
| | | −Hx_th and −Hy | [1, 1, 0, 0] | +Hx and −Hy | [1, 1, 1, 0] | −Hx and +Hy | [0, 1, 1, 0] |
| | | | | −Hx and +Hy | [0, 1, 0, 0] | +Hx and −Hy | [0, 1, 1, 0] |
| | | −Hx and +Hy | [0, 1, 1, 1] | −Hx and −Hy | [0, 1, 0, 1] | | |
| | | −Hx and −Hy | [1, 1, 0, 1] | −Hx and +Hy | [0, 1, 0, 1] | | |
| −Hx_th and ±Hy | [0,0,0,0] | +Hx_th and −Hy | [0, 0, 1, 1] | −Hx and −Hy | [0, 0, 0, 1] | +Hx and +Hy | [1, 0, 0, 1] |
| | | | | +Hx and +Hy | [1, 0, 1, 1] | −Hx and −Hy | [1, 0, 0, 1] |
| | | +Hx_th and +Hy | [1, 1, 0, 0] | −Hx and +Hy | [0, 1, 0, 0] | +Hx and −Hy | [0, 1, 1, 0] |
| | | | | +Hx and −Hy | [1, 1, 1, 0] | −Hx and +Hy | [0, 1, 1, 0] |
| | | +Hx and +Hy | [1, 0, 0, 0] | +Hx and −Hy | [1, 0, 1, 0] | | |
| | | +Hx and −Hy | [0, 0, 1, 0] | +Hx and +Hy | [1, 0, 1, 0] | | |

Figure 7:
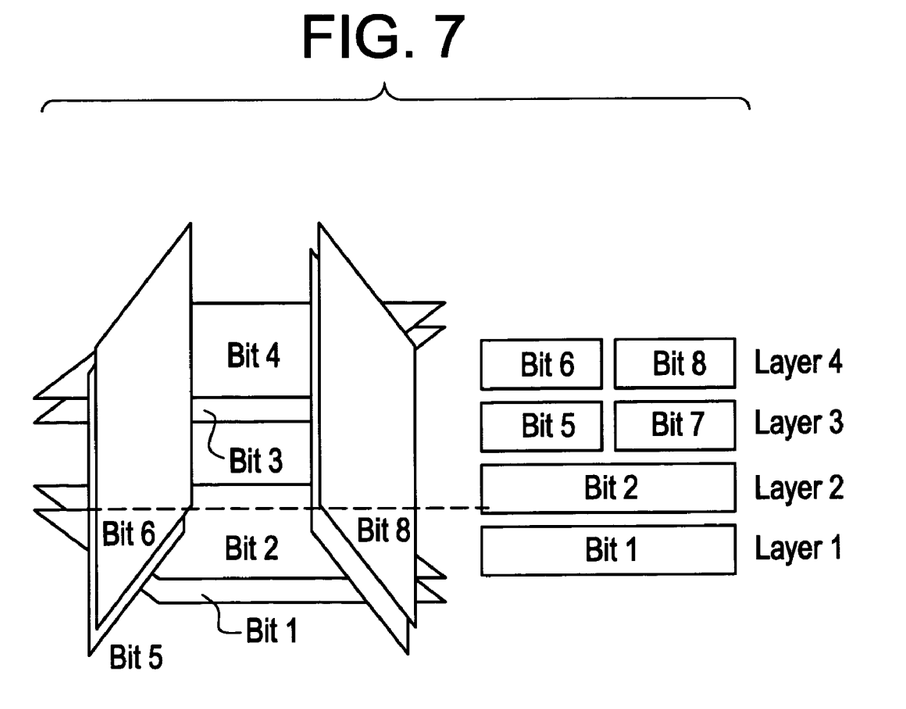
FIG. 7 schematically illustrates a top and cross-section view of an eight-bit cell according to an exemplary embodiment of the present invention.

FIG. 7 depicts a top and cross-sectional view showing the design of an eight-bit cell structure according to an exemplary embodiment of the present invention. Using the four-bit cell structure as shown in FIG. 6 as a basic cell, then two 'four-bit cells' are stacked on top of each other. An orthogonal configuration is obtained as an eight-bit structure. In this configuration, the spin precession excitation field for bits 5, 6, 7 and 8 is applied along the x-axis, and along the y-axis for bits 1, 2, 3 and 4. All four ferromagnetic layers may have the same or different ferromagnetic materials.

Multi-bit MRAM of the present invention may be created by growing magnetic multilayers with distinct, saturation magnetization free magnetic layers, where each free layer can store one binary bit information. The memory cell shape can be, for example, rectangular or elliptical. The layers may be formed by film-patterning, doping, etching, and polishing techniques known in the art.

Figure 8A:
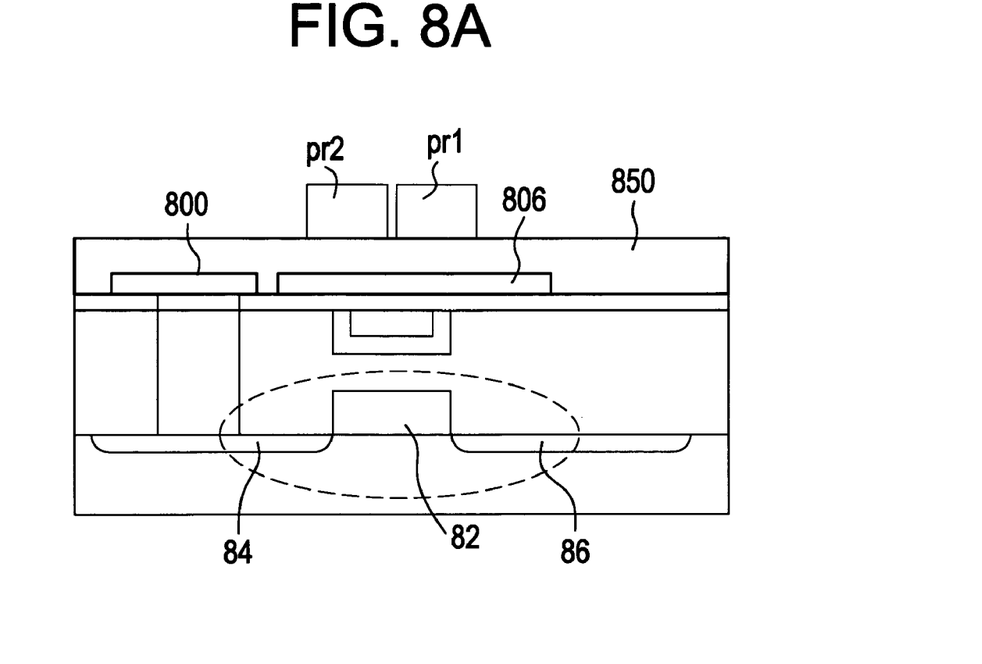
FIGS. 8A and 8B illustrate a stage of forming a two-bit cell structure according to the invention prior to an etching process to create the bits.
Figure 8B:
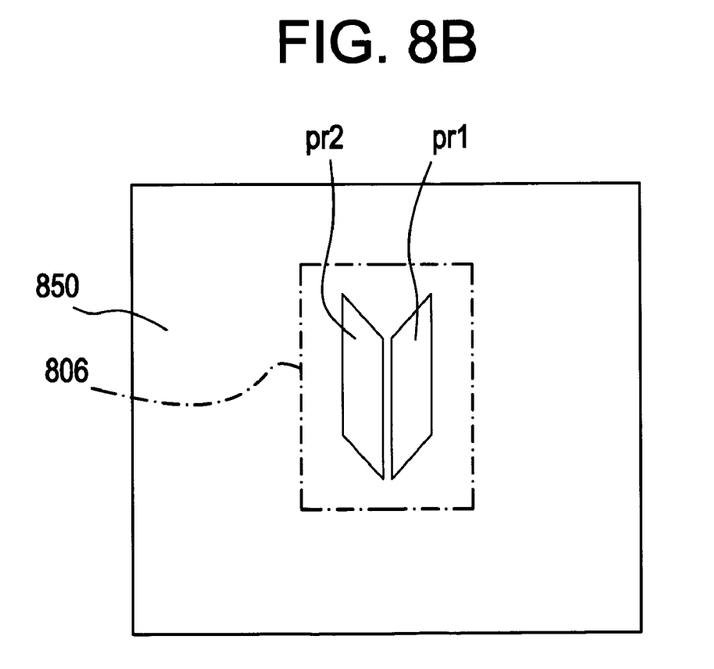

As shown in FIGS. 8A and 8B, during the manufacturing process, source area 84 is formed to the left of gate 82 while common drain area 86 is formed to the right of gate 82. These form the basic of a transistor structure. Magnetic multilayer 850 as described in [58] [59] is formed to cover the first and second pads 800, 806. Also formed are first and second patterns pr1, pr2 above a predetermined area of layer 850. Because patterns pr1, pr2 are areas where the actual bit data is to be recorded, pr1, pr2 are formed closely, but do not contact each other. The distance between pr1, and pr2 may be adjusted during the manufacturing process, as well as the shape of pr1, and pr2. Then, pr1, and pr2 are used as masks to form the memory bits from layer 850.

Figure 9A:
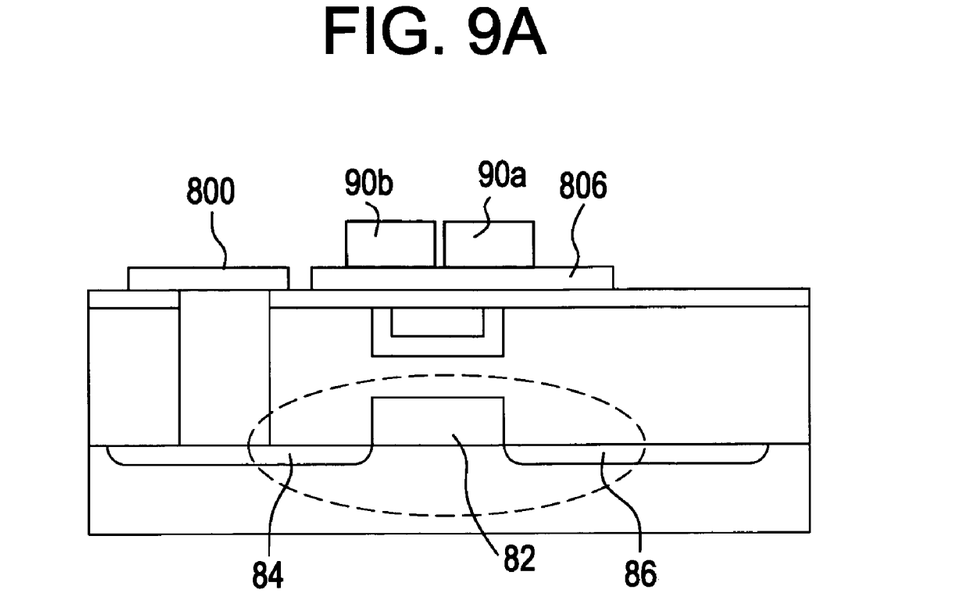
FIGS. 9A and 9B illustrate a stage of forming a two-bit cell structure according to the invention after an etching process to create the bits.
Figure 9B:
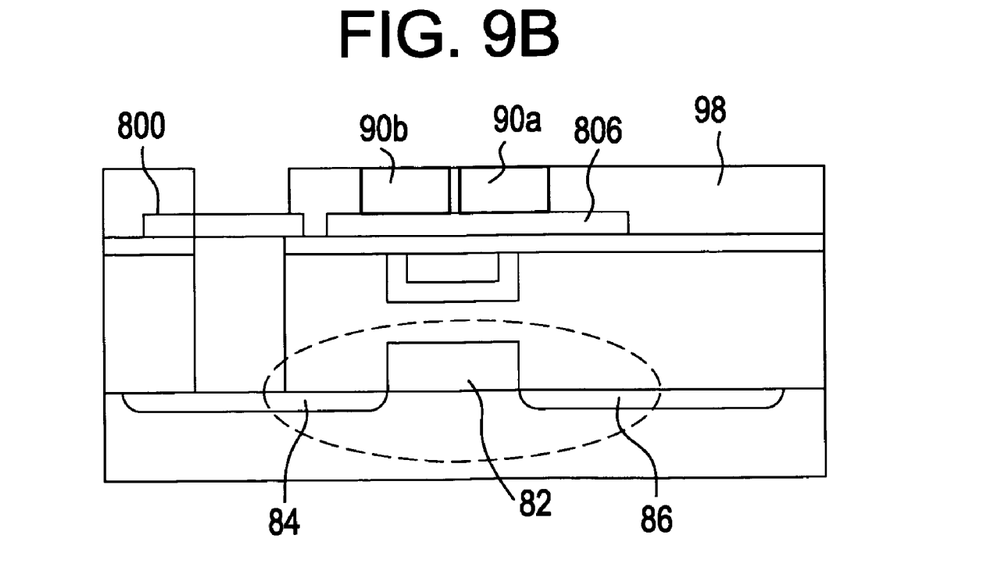

FIG. 9A shows the memory bits 90a and 90b that have been formed from layers 850 using pr1, and pr2 as the masks through multiple steps of chemical and/or plasma etching processes. The etching process is stopped once layer 806 is exposed. The remaining portions of pr1, and pr2 must be removed through further chemical and/or plasma cleaning processes. Subsequently, as shown in FIG. 9B, layer 98 is formed to cover the memory bits 90a and 90b and first and second pads 800, 806. Layer 98 may be smoothed until the memory bits 90a, 90b are exposed. Methods for smoothing layer 98 may include, for example, etching and chemical/mechanical polishing. Layer 98 is non-conductive and its function is to isolate the first and second contact pad 806. The top contact pad will be deposited at the top surface and in contact with memory bits 90a and 90b.

The difference in saturation magnetization allows recording information in one bit without affecting the information in the other bit. This allows for selective writing, and is made possible because the two magnetic free layers have different spin precession cone angles.

Accordingly, the present invention allows for improved data density by using a multi-bit MRAM structure, where the memory cells are arranged such that an effective remnant magnetization of each of the cells is non-parallel from the cells' long axis.

Further, the present invention may use spin precessional switching which is energy efficient.

In addition, high frequency cell writing is possible, therefore leading to a higher data transfer rate.

Finally, the present invention allows for reducing the number of bit and word lines in the current MRAM architecture for a multi-bit MRAM.

Although exemplary embodiments of the present invention have been described for illustrative purposes, those skilled in the art will appreciate that various modifications, additions and substitutions are possible, without departing from the scope and spirit of the invention as disclosed in the accompanying claims, including the full scope of equivalents thereof.

What is claimed is:

1. A magnetic memory comprising:
   at least one pair-cell, each pair-cell comprising first and second memory cells, and the first and second memory cells each having a magnetic multilayer structure, the structure comprising:
   a magnetically changeable ferromagnetic layer;
   a ferromagnetic reference layer having a non-changeable magnetization state; and
   a corresponding spacer layer separating the magnetically changeable and non-changeable ferromagnetic layers,
   wherein the first and second memory cells are arranged such that an effective remnant magnetization of each of the cells is non-parallel from the long-axis of the cells, and
   each pair-cell is located at an intersection of a bit line and a word line.

2. The magnetic memory according to claim 1, wherein the spacer layer is non-conductive.

3. The magnetic memory according to claim 1, wherein the spacer layer is conductive.

4. The magnetic memory according to claim 1, wherein the magnetically changeable ferromagnetic layer of the first memory cell of the pair-cell has a same or differing ferromagnetic material as the magnetically changeable ferromagnetic layer of the second memory cell of the pair-cell.

5. The magnetic memory according to claim 1, wherein the magnetically changeable ferromagnetic layer of the first memory cell of the pair-cell has a same or differing thickness as a thickness of the magnetically changeable ferromagnetic layer of the second memory cell of the pair-cell.

6. The magnetic memory according to claim 1, wherein the magnetically changeable ferromagnetic layer of the first memory cell of the pair-cell has a same or differing saturation magnetic moment as the magnetically changeable ferromagnetic layer of the second memory cell of the pair-cell.

7. The magnetic memory according to claim 1, wherein the magnetically changeable ferromagnetic layer of the first memory cell of the pair-cell has a same or differing magnetocrystalline anisotropy as the magnetically changeable ferromagnetic layer of the second memory cell of the pair-cell.

8. The magnetic memory according to claim 1, wherein the first and second memory cells have a same or differing cell shape.

9. The magnetic memory according to claim 1, wherein the first and second memory cells have a quadrilateral shape, and a length of each memory cell is larger than a width of the memory cell.

10. The magnetic memory according to claim 9, wherein shorter ends of each of the first and second memory cells are angled away from the long axis of the memory cell, at angles less than 90°.

11. The magnetic memory according to claim 10, wherein the angles are in a range of about 5° to 85°.

12. The magnetic memory according to claim 9, wherein the first memory cell of the pair-cell has its shorter ends angled in a direction above a horizontal plane, while the second memory cell has its shorter ends angled in an opposing direction below the horizontal plane.

13. The magnetic memory according to claim 9, wherein an intersection of a long side with a short side in at least one of the first and second memory cells is rounded to suppress magnetic domain nucleation.

14. The magnetic memory according to claim 9, wherein the long axis of each of the first and second memory cells is angled away from a horizontal plane.

15. The magnetic memory according to claim 14, wherein the long axis of the first memory cell of the pair-cell is angled above the horizontal plane, while the long axis of the second memory cell is angled in a direction opposite to the long axis of the first memory cell, below the horizontal plane.

16. The magnetic memory according to claim 15, wherein the long axis of the first memory cell is at an angle in a range of about 1° to 85°, while the long axis of the second memory cell is at an angle in a range of about −1° to −85°.

17. The magnetic memory according to claim 9, wherein the first memory cell of the pair-cell has its shorter ends angled in a direction above a horizontal plane, while the long axis of the second memory cell is angled below the horizontal plane.

18. The magnetic memory according to claim 9, wherein the first memory cell of the pair-cell has its shorter ends angled in a direction below a horizontal plane, while the long axis of the second memory cell is angled above the horizontal plane.

19. The magnetic memory according to claim 1, wherein the first and second memory cells are separated at a distance of at least half the width of a cell to minimize magnetostatic coupling between the cells.

20. The magnetic memory according to claim 1, wherein the first and second memory cells of the pair-cell share a same orthogonal current line.

21. The magnetic memory according to claim 1, wherein the first and second memory cells of the pair-cell have a shared or separate transistor for sensing operation.

22. The magnetic memory according to claim 1, wherein an aspect ratio of each cell is between 1.1 and 5.0.

23. The magnetic memory according to claim 22, wherein the first and second memory cells of the pair-cell have a same or differing aspect ratio.

24. The magnetic memory according to claim 1, wherein the magnetically changeable ferromagnetic layer comprises an alloy of Ni, Fe and Co, or a combination thereof.

25. The magnetic memory according to claim 1, wherein the first and second memory cells each have a plurality of magnetically changeable ferromagnetic layers, one of the magnetically changeable ferromagnetic layers at a bottom of the structure, and another at a top of the structure.

26. The magnetic memory according to claim 25, wherein each magnetically changeable ferromagnetic layer stores one bit of binary information.

27. The magnetic memory according to claim 25, comprising two pair-cells, wherein each pair-cell stores two bits of binary information.

28. The magnetic memory according to claim 27, comprising four pair-cells, with two pair cells stacked on top of each other in an orthogonal configuration, forming an eight bit cell structure.

29. The magnetic memory according to claim 28, wherein a spin precession excitation field axis for a bottom four bits is perpendicular to a top four bits, such that when the bottom four bits cell are excited to precession, the top four bits are not excited to precession.

30. The magnetic memory according to claim 28, wherein a spin precession excitation field axis for a bottom four bits is perpendicular to a top four bits, such that when the top four bits cell are excited to precession, the bottom four bits are not excited to precession.

31. The magnetic memory according to claim 1, wherein the first and second memory cells of the pair-cell have a same or differing spin precession frequency.

32. The magnetic memory according to claim 1, where the first and second memory cells of the pair-cell have a same or differing magnetic damping constant to allow for magnetic energy dissipation.

\* \* \* \* \*